(12) United States Patent
Smithson et al.

(10) Patent No.: US 10,842,026 B2
(45) Date of Patent: Nov. 17, 2020

(54) SYSTEM FOR FORMING ELECTRICAL CIRCUITS ON NON-PLANAR OBJECTS

(71) Applicant: Xerox Corporation, Norwalk, CT (US)

(72) Inventors: Chad S. Smithson, Toronto (CA); Ethan Shen, Toronto (CA); Johann Junginger, Toronto (CA); Tianxiao Xu, Oakville (CA)

(73) Assignee: Xerox Corporation, Norwalk, CT (US)

( * ) Notice: Subject to any disclaimer, the term of this patent is extended or adjusted under 35 U.S.C. 154(b) by 244 days.

(21) Appl. No.: 15/893,859

(22) Filed: Feb. 12, 2018

(65) Prior Publication Data

US 2019/0254171 A1 Aug. 15, 2019

(51) Int. Cl.
| | | |
|---|---|---|
| *H05K 3/12* | (2006.01) | |
| *H05K 13/04* | (2006.01) | |
| *H05K 13/08* | (2006.01) | |
| *H05K 13/00* | (2006.01) | |
| *H05K 3/00* | (2006.01) | |
| *G06T 17/05* | (2011.01) | |

(52) U.S. Cl.
CPC ............. *H05K 3/1275* (2013.01); *H05K 3/00* (2013.01); *H05K 13/0015* (2013.01); *H05K 13/046* (2013.01); *H05K 13/0408* (2013.01); *H05K 13/08* (2013.01); *G06T 17/05* (2013.01)

(58) Field of Classification Search
CPC .......... H05K 3/12; H05K 3/1266; H05K 3/30; H05K 3/341; H05K 3/3431; H05K 3/00; H05K 3/1275; H05K 13/0015; H05K 13/0408; H05K 13/046; H05K 13/08; G06T 17/05

See application file for complete search history.

(56) References Cited

U.S. PATENT DOCUMENTS

| | | | | |
|---|---|---|---|---|
| 5,084,959 A | * | 2/1992 | Ando | ..................... H01L 21/681 |
| | | | | 29/740 |
| 5,694,219 A | * | 12/1997 | Kim | ................... H05K 13/0812 |
| | | | | 356/615 |
| 5,882,722 A | * | 3/1999 | Kydd | ....................... H01B 1/02 |
| | | | | 257/E23.075 |

(Continued)

FOREIGN PATENT DOCUMENTS

| | | |
|---|---|---|
| WO | 2007/120877 A2 | * 10/2007 |
| WO | 2015/198291 A1 | * 12/2015 |

*Primary Examiner* — Carl J Arbes
(74) *Attorney, Agent, or Firm* — Maginot Moore & Beck LLP

(57) ABSTRACT

An object printing system printer enables printing of electrical circuits on non-planar areas of objects and the accurate placement of electronic components within the printed circuits. The system includes a direct-to-object printer and an electronic component placement system. The direct-to-object printer is configured to form an electrical circuit on an object secured within the direct-to-object printer. The electronic component placement system is configured to retrieve an electronic component and install the electronic component in the electrical circuit on the object secured within the direct-to-object printer in response to the direct-to-object printer generating a signal for the electronic component placement system that indicates the electronic component is to be installed in the circuit on the object secured within the direct-to-object printer.

11 Claims, 4 Drawing Sheets

(56) References Cited

U.S. PATENT DOCUMENTS

| | | | |
|---|---|---|---|
| 6,538,244 B1* | 3/2003 | Skunes | H05K 13/0812 250/208.1 |
| 6,580,961 B2* | 6/2003 | Diggin | G05B 19/41875 700/121 |
| 6,608,320 B1* | 8/2003 | Skunes | G01B 11/024 250/559.19 |
| 7,653,982 B2* | 2/2010 | Chopra | G06K 19/0672 29/600 |
| 2008/0099232 A1 | 5/2008 | Mayder | |
| 2009/0142481 A1* | 6/2009 | Chopra | C09D 11/38 427/123 |
| 2009/0226605 A1* | 9/2009 | Chopra | H05K 1/097 427/125 |
| 2011/0154661 A1 | 6/2011 | Park et al. | |
| 2011/0184548 A1* | 7/2011 | Higashi | H05K 13/0417 700/121 |
| 2016/0278200 A1 | 9/2016 | Costes | |
| 2017/0142843 A1 | 5/2017 | Zhang | |
| 2017/0303401 A1 | 10/2017 | Rathburn | |

* cited by examiner

SYSTEM FOR FORMING ELECTRICAL CIRCUITS ON NON-PLANAR OBJECTS

TECHNICAL FIELD

This disclosure relates generally to systems for forming electrical circuits having electronic components, and more particularly, to systems that form these electrical circuits on objects.

BACKGROUND

Systems are known that form electrical circuits on the surfaces of flat objects. Even with circuits printed on flexible or stretchable substrates, the electronic components still require mounting on planar surfaces within the circuit. Electronic component placement within printed circuits requires precise alignment, such as 10 µm or better, to ensure all pins on the component make electrical connections with the appropriate conductive traces in the circuit. Thus, the challenges to form electrical circuits on planar surfaces and populate them with electronic components can be significant. These challenges are exacerbated when electrical circuits are desired on objects with non-planar surfaces. Yet many such applications would be useful. For example, electrical circuits having monitoring sensors would be useful mounted to pipes. Presently, these circuits are formed on flexible substrates while the substrate is maintained in a planar state and then the flexible substrate and circuit is mounted to a pipe with adhesive. This approach, however, requires two separate processes. Accordingly, the time to produce the pipe with the electrical circuit is relatively long and the transitioning from one process to the other can be inefficient. Being able to form electrical circuits directly on non-planar objects and accurately installing electronic components within these electrical circuits would be beneficial.

SUMMARY

A new object printing system enables printing of electrical circuits on non-planar substrates and the accurate placement of electronic components within the printed circuits. The printing system includes a direct-to-object printer, the direct-to-object printer being configured to form an electrical circuit on an object secured within the direct-to-object printer, and an electronic component placement system, the electronic component placement system being configured to retrieve an electronic component and install the electronic component in the electrical circuit on the object in response to the direct-to-object printer generating a signal for the electronic component placement system that indicates the electronic component is to be installed in the circuit on the object secured within the direct-to-object printer.

A method of operating an object printing system enables printing of electrical circuits on non-planar substrates and the accurate placement of electronic components within the printed circuits. The method includes forming an electrical circuit on a three-dimensional (3D) object with a direct-to-object printer, the 3D object being secured within the direct-to-object printer, generating with the direct-to-object printer a signal that indicates an electronic component is to be installed in the electrical circuit formed on the 3D object by the direct-to-object printer, receiving at an electronic component placement system the signal generated by the direct-to-object printer, and retrieving and installing the electronic component in the electrical circuit on the 3D object with the electronic component placement system in response to the signal generated by the direct-to-object printer being received by the electronic component placement system.

An alternative embodiment of the object printing system enables printing of electrical circuits on non-planar substrates and the accurate placement of electronic components within the printed circuits. The alternative embodiment of the object printing system includes a multi-nozzle extruder configured to extrude a material containing conductive material toward an object secured by a holder to form an electrical circuit on the object, a plurality of actuators operatively connected to the multi-nozzle extruder, the actuators in the plurality of actuators being configured to move the multi-nozzle extruder along three orthogonal axes bidirectionally and to rotate the multi-nozzle extruder about two of the orthogonal axes bidirectionally, the two orthogonal axes about which the multi-nozzle extruder rotates being within a plane perpendicular to the third axis, and a controller operatively connected to the plurality of actuators and the multi-nozzle extruder. The controller is configured to operate the actuators in the plurality of actuators to move the aerosol printer along three orthogonal axes bidirectionally and to rotate the aerosol printer about the two orthogonal axes within the plane perpendicular to the third axis bidirectionally, and to operate the multi-nozzle extruder to extrude the material containing the conductive material toward the object secured by the holder to form the electrical circuit on the object. The system also includes an electronic component placement system, the electronic component placement system being configured to retrieve an electronic component and install the electronic component in the electrical circuit on the object secured by the holder in response to the multi-nozzle extruder generating a signal for the electronic component placement system that indicates the electronic component is to be installed in the circuit on the object secured by the holder.

BRIEF DESCRIPTION OF THE DRAWINGS

The foregoing aspects and other features of an object printing system and method of operating an object printing system that enables printing of electrical circuits on non-planar substrates and the accurate placement of electronic components within the printed circuits are explained in the following description, taken in connection with the accompanying drawings.

DETAILED DESCRIPTION

Figure 1:
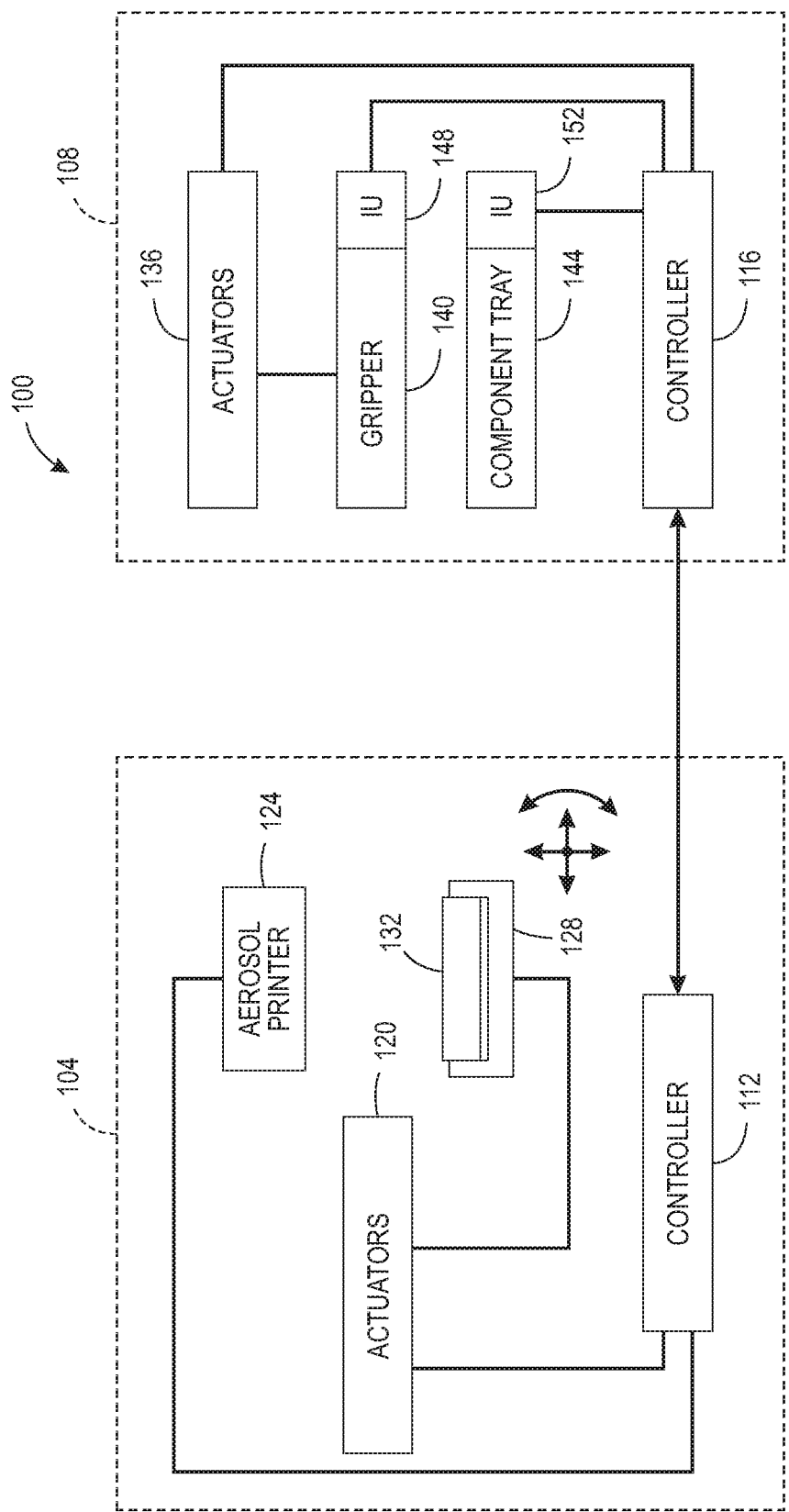
FIG. 1 is a block diagram of an object printing system that enables printing of electrical circuits on non-planar substrates and the accurate placement of electronic components within the printed circuits.

For a general understanding of the present embodiments, reference is made to the drawings. In the drawings, like reference numerals have been used throughout to designate like elements.

FIG. 1 depicts a block diagram of an object printing system 100 useful for forming electrical circuits on the surfaces of non-planar objects and installing electronic components in the circuits. The system 100 includes a direct-to-object printer 104 and an electronic component placement system 108. The direct-to-object printer 104 includes a controller 112 to operate the components of the printer and the electronic component placement system 108 includes a controller 116 to operate the components of the system 108. The controllers 112 and 116 communicate with one another to synchronize the operations of the printer 104 and the electronic component placement system 108. As used in this document, the term "direct-to-object printer" means a device that directs, places, or ejects material onto an object surface in accordance with digital data representing the surface of the object and the positions for placement of the material or materials.

Figure 3:
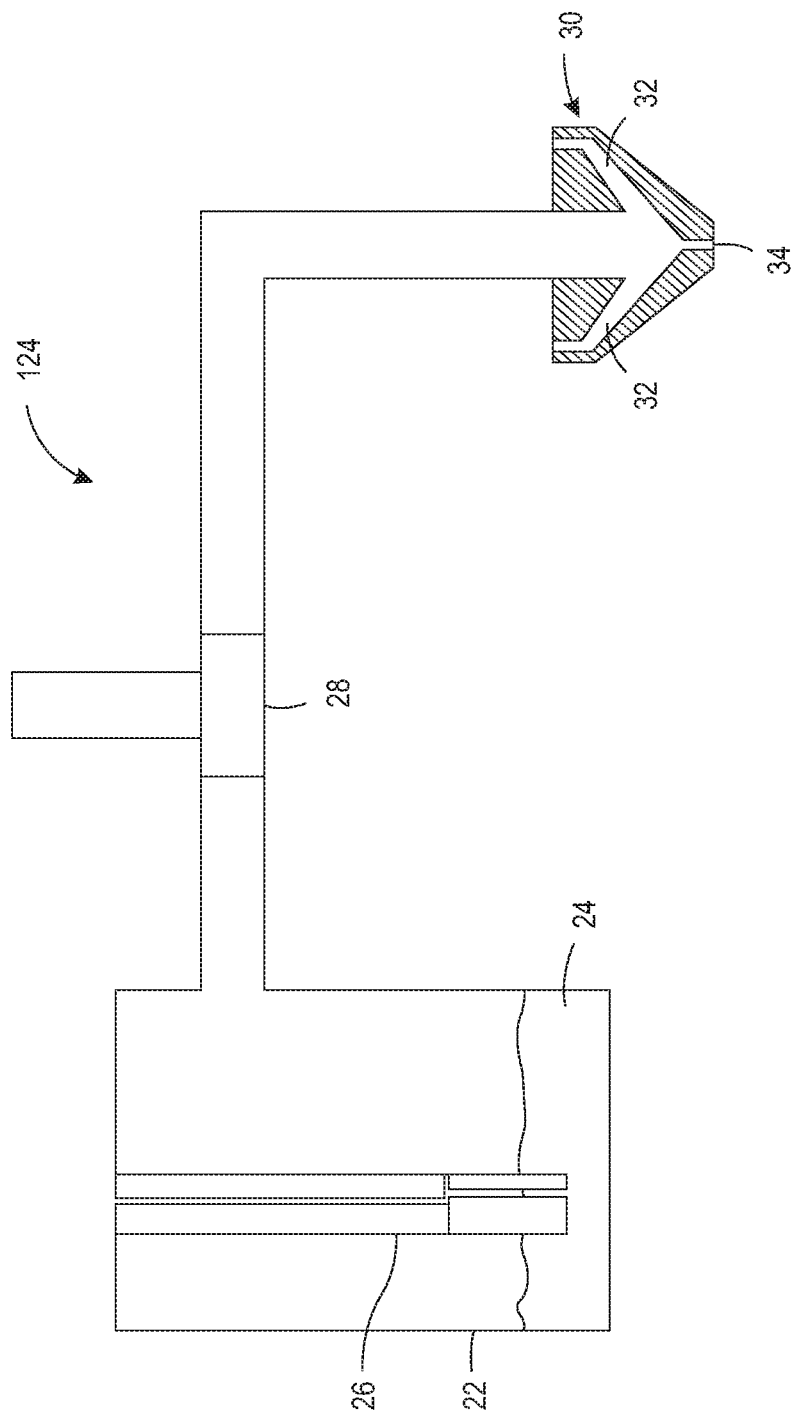
FIG. 3 depicts a schematic diagram of a prior art aerosol printing system that can be used in the system of FIG. 1.

The direct-to-object printer 104 includes one or more actuators 120, an aerosol printer 124, and an object holder 128. The actuators 120 and the aerosol printer 124 are operatively connected to the controller 112. A known aerosol printer is shown in FIG. 3. As shown in that figure, the aerosol printer 124 includes atomizer 22, conduit 26, impactor 28, and a deposition head 30 having focusing conduits 32 and a nozzle 34. Fluid 24 to be atomized by the printer 124 is introduced into the atomizer 22, which forms an aerosol comprised of droplets of the fluid 24 that are entrained into a gas flow introduced through conduit 26. This atomization gas flow is passed through the impactor 28 where excess gas is removed to make the atomization gas flow denser. The atomized gas flow, also called an aerosol, flows to the deposition head 30 where a sheath gas flows through focusing conduits 32 to focus the aerosol into a tight jet of gas that is directed by the nozzle 34 onto a substrate. As noted with regard to FIG. 1, the controller 112 is operatively connected to the aerosol printer 124 and actuators 120. The controller 112 is configured with programmed instructions that uses data corresponding to the surface of the object and the electrical circuit to be formed on the object to operate the aerosol printer 124 and the actuators 120 to move the printer with reference to the substrate to form electrical circuits on the surface of an object held by the holder 128. The data corresponding to the circuit to be formed on the object can be CAD data integrated with CAD data of the object or the like. In addition to the conductive electrical paths and the conductive pads where the electronic components are installed, the data used to operate the aerosol printer and the actuators includes data for the formation of fiducial marks on the object surface for reasons described more fully below. The general process of digital printing using an aerosol printer, such as the one depicted in FIG. 3, is well known in the art.

The actuators 120 are operatively connected to the object holder 128 and move the holder and the object secured by the holder in an X-Y plane that extends into and out of the plane of FIG. 1, bidirectionally toward and away from the aerosol printer 124, and that also bidirectionally tilts the object and holder 128 as shown by the curved double-headed arrow in the figure. Additionally, the actuators 120 can be configured to tilt the holder 128 and the object 132 so the edge visible in FIG. 1 moves toward the aerosol printer, while the opposite edge moves away from the aerosol printer and also in the reverse direction. All of these degrees of freedom enable the holder and object to be moved bidirectionally in the orthogonal directions X, Y, and Z as well as in the tilting or rotational directions about the X axis and the Y axis, both of which lie in a plane perpendicular to the Z axis. Thus, the object 132 can be oriented so the aerosol printer 124 can direct the aerosol on surfaces of the object that are non-planar. While the actuators 120 are discussed above as implementing a five-axis movement system, the actuators 120 can be configured in a robotic arm to provide a six-axis movement system for the aerosol printer.

Figure 4:
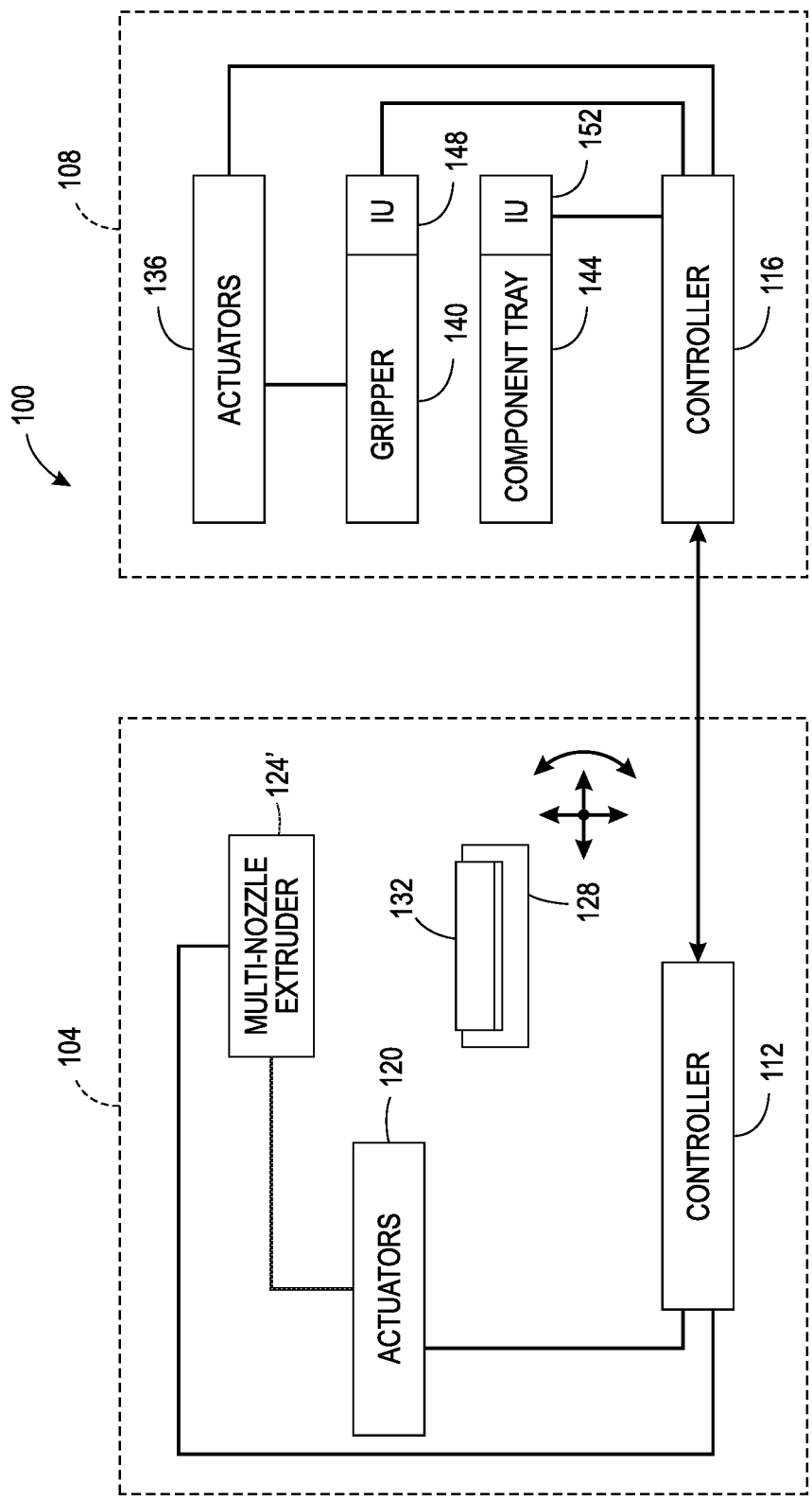
FIG. 4 is an alternative embodiment of the system shown in FIG. 1 in which the aerosol printer is replaced with a multi-nozzle extruder.

In another alternative embodiment, the aerosol printer is replaced with a multi-nozzle extruder 124' as shown in FIG. 4. In a multi-nozzle extruder, each nozzle is independently supplied with material to enable conductive and electrically insulating materials to be extruded to form one or more electrical circuits on the object 132. In another alternative embodiment, the aerosol printer is replaced with a known 3D object printer that uses ejectors within one or more printheads to eject drops of material to form the one or more electrical circuits on the object. In the embodiments in which the aerosol printer is replaced with either a multi-nozzle extruder 124' or a 3D object printer that uses printheads to eject drops of material, the actuators 120 are operatively connected to the extruder or printhead array, instead of the holder 128, to enable the extruder or printhead array to move with the degrees of freedom described above for the holder to enable the extruder or printhead array to form electrical circuits on non-planar portions of the object 132.

With regard to these various embodiments using different types of printers, the readers should be aware that depending upon the surface on which the electrical circuit is to be printed different types of printers provide different advantages. For example, objects that have surfaces with quickly changing elevations of 2 to 5 mm in height, the aerosol printer is more advantageous since the nozzle of the aerosol printer is typically held 3 to 5 mm from the surface being printed by the nozzle. Inkjet printheads are typically held at less than 1 mm from the surface being printed so this type of printer does not perform as well with more rapidly changing surfaces or surfaces having significant undulations or curves. Extruders also do not perform as well aerosol printers with surfaces having more rapidly changing surfaces or surfaces having significant undulations or curves because the ribbon of material extruder from the nozzle of the extruder may distend or become somewhat unstable when the distance between the nozzle and the surface increases to the distances at which the aerosol printers typically work. Additionally, aerosol printers handle a wider range of material viscosities. For example, aerosol printers can reasonably handle materials in a range of about 5 to about 2000 centipoise (cP). Printing electrical circuits requires the ability to handle a wide range of different viscosities. In one embodiment, the conductive material used to form electrically conductive paths in the electrical circuit has a viscosity of about 10 cP, while the conductive adhesives used for attaching the electronic components has a viscosity of about 1000 cP. Also, the maximum width of the stream from an aerosol nozzle is about 10 mm, which comports well with the widths of the areas formed for the attachment of electronic components. In the embodiments having an aerosol printer, the actuators move the holder 128 rather than the aerosol printer 124 since the operation of aerosol printers are affected by movement. In the embodiments using a multi-nozzle extruder or a printhead array, the material emitted head can be moved rather than the object.

With further reference to FIG. 1, electronic component placement system 108 includes actuators 136, gripper 140, a first imaging unit 148, a component tray 144, and a second imaging unit 152. The component tray 144 has one or more bins that contain electronic components, both active and passive, that are used to populate the circuits formed in the object 132 by the printer 104. As used in this document, "electronic component" means any device that performs an electrical function in an electrical circuit. As used in this document, the term "electrical circuit" means one or more paths of electrically conductive material having areas configured to receive electronic components for integrating the electronic components into the circuit. The controller 116 is operatively connected to the actuators 136 and the imaging unit 148 and is configured with programmed instructions to operate the actuators to remove an electronic component from the tray 144 with the gripper 140 and then move the gripper to a position opposite the object secured by holder 128 for installation of the component in a circuit on the object 132. The imaging units 148 and 152 are CCD cameras or the like. The imaging unit 148 is oriented to generate image data of an area opposite the gripper 140 at a predetermined focal distance, while the imaging unit 152 is oriented to generate image data of the gripper as it approaches the component tray 144. The controller 116 receives the image data generated by the imaging units 148 and 152 and executes programmed instructions that process the image data. The controller 116 processes the image data to identify an appropriate electronic component for the gripper 140 to acquire from the tray 144 and to confirm the position and orientation of the gripper as it approaches the component. After the component is acquired, the imaging unit 148 continues to generate image data of the object surface opposite the gripper to identify a conductive adhesive or solder pad or the like in a circuit on object 132 for installation of the component on the pad. The controller continues to process the image data to ensure the system 108 places the electronic component on the appropriate pad. A portion of this image data processing includes identification of fiducial marks in the vicinity of the conductive pads to aid in the identification of the pads and the installation of the components on the pads. Thus, when the controller 112 of the printer 104 has completed a circuit or portion of an electrical circuit on the object 132 that includes one or more adhesive or solder pads for one or more electronic components, the controller 112 generates a signal for controller 116 to remove the component from the tray 144 and install it in the circuit on the object 132. As used in this document, the word "install" means to place an electronic component on an adhesive or solder pad in an electrical circuit to connect the electronic component electrically to the electrical circuit. Also, as used in this document, the word "gripper" refers to any structure configured to hold and release an electronic component selectively. In one embodiment, the gripper is implemented with a vacuum pad, which is a porous structure to which a negative air pressure is applied to hold an electronic component against the structure until the negative air pressure is terminated to enable the electronic component to be released from the structure.

Figure 2:
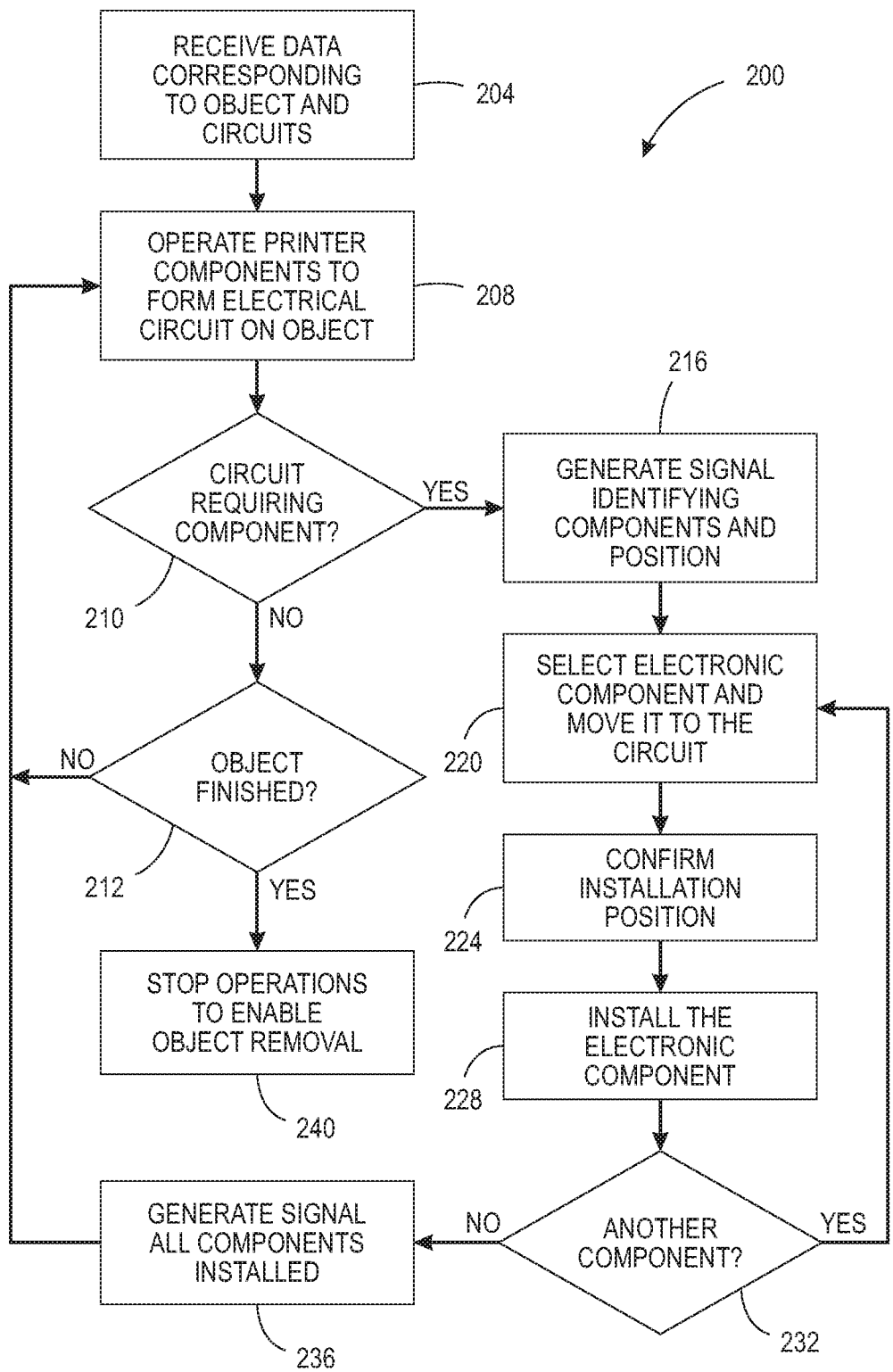
FIG. 2 depicts a process for operating the system of FIG. 1.

A process for operating the system 100 is shown in FIG. 2. In the description of the process, statements that the process is performing some task or function refers to a controller or general purpose processor executing programmed instructions stored in non-transitory computer readable storage media operatively connected to the controller or processor to manipulate data or to operate one or more components in the printer to perform the task or function. The controllers 112 and 116 noted above can be such a controller or processor. Alternatively, the controller can be implemented with more than one processor and associated circuitry and components, each of which is configured to form one or more tasks or functions described herein. Additionally, the steps of the process may be performed in any feasible chronological order, regardless of the order shown in the figures or the order in which the processing is described.

FIG. 2 is a flow diagram of a process 200 that operates the object printing system 100 to enable printing of electrical circuits on non-planar layers of an object being held by the holder 128 of the printer 104 and the accurate placement of electronic components within the circuits printed on that object by the printer. The process 200 begins with the printer 104 receiving data corresponding to an electrical circuit to be formed on the object (block 204). The controller 112 operates the actuators 120 and the aerosol printer 124 to direct an aerosol stream toward the object 132 held the holder 128 to form an electrical circuit on the object (block 208). This processing also includes the application of solder or adhesive on the areas where electronic components are to be placed. The printing of the conductive electrical paths and the printing of the conductive areas for component attachment can be performed by the same aerosol printer or by different aerosol printers. When the same aerosol printer is used, the aerosol printer is cleaned and connected to a source of conductive adhesive after the conductive electrical paths are printed. When multiple aerosol printers are used, one printer can be connected to the conductive material used to form electrical paths and another printer can be connected to the conductive adhesive material or solder. Since the deposition head 30 of each printer is relatively small, for example, 10 cm by 5 cm by 5 cm in one embodiment, they are be kept relatively close to the object surface for printing without blocking one another, while the remainder of each aerosol printer is located remotely from the object surface and connected to the deposition head 30 by a flexible conduit. When a circuit on the object 132 requires one or more electronic components (block 210), the process signals the component placement system 108 that one or more electronic components are needed for the circuit (block 216). This signal includes identifiers that identify the components to be installed in the circuit printed on the object and the coordinates for placement of the components in the layer. The component placement system 108 operates the gripper with reference to the image data generated by the imaging units 148 and 152 to select the one of the identified components and operates the actuators 136 to move the gripper to the coordinates for placement of the component as the printer 104 operates the actuators 120 to maneuver the holder and object to a position that makes the site for the electronic component most accessible (block 220). The movement of the gripper and the holder with the object is made with reference to the image data that continues to be generated by the camera 152 as the gripper is maneuvered to install the electronic component and the component placement system 108 confirms the position and orientation of the component for placement in the circuit on the object 132 by processing the image data from the imaging unit 148 (block 224). Once confirmed, the system 108 operates the gripper 140 to install the component on the adhesive or solder pad and then operates the actuators 136 to retract the gripper 140 (block 228). The selection and placement are performed for each component in a circuit (blocks 220 to 228) until all of the components for the circuit have been installed (block 232). The component placement system 108 sends a signal to the printer that the components have been installed in the circuit (block 236) so the printer can continue further printing of the object (block 208). Whenever components are required for circuits printed on the object 132, the printer 104 and the component placement system 108 cooperate through the operation of the actuators in each respective system to install the components in the circuit (blocks 210 to 228). This process continues until all of the electrical circuits on the object have been formed and all of the electronic components installed in the circuits (block 212). The completed object can then be removed from the printer 104 (block 240).

It will be appreciated that variations of the above-disclosed apparatus and other features, and functions, or alternatives thereof, may be desirably combined into many other different systems or applications. Various presently unforeseen or unanticipated alternatives, modifications, variations, or improvements therein may be subsequently made by those skilled in the art, which are also intended to be encompassed by the following claims.

What is claimed is:

1. An object printing system comprising:
    a direct-to-object printer, the direct-to-object printer being configured to form an electrical circuit on an object secured within the direct-to-object printer and to generate a signal that indicates an electronic component is to be installed in the electrical circuit formed on the object secured within the direct-to-object printer; and
    an electronic component placement system, the electronic component placement system being configured to retrieve the electronic component and install the retrieved electronic component in the electrical circuit formed on the object by the direct-to-object printer in response to the electronic component placement system receiving the signal generated by the direct-to-object printer that indicates the electronic component is to be installed in the electrical circuit formed on the object secured within the direct-to-object printer.

2. The object printing system of claim 1, the direct-to-object printer further comprising:
    a holder configured to secure the object on which the electrical circuit is formed;
    an aerosol printer configured to direct a fluid containing conductive material toward the object secured by the holder to form the electrical circuit on the object;
    a plurality of actuators operatively connected to the holder, the actuators in the plurality of actuators being configured to move the holder along three orthogonal axes bidirectionally and to rotate the holder about two of the orthogonal axes bidirectionally, the two orthogonal axes about which the holder rotates being within a plane orthogonal to the third axis; and
    a controller operatively connected to the plurality of actuators and the aerosol printer, the controller being configured to operate the actuators in the plurality of actuators to move the holder along three orthogonal axes bidirectionally and to rotate the holder about the two orthogonal axes within the plane perpendicular to the third axis bidirectionally, and to operate the aerosol printer to direct the fluid containing the conductive material toward the object secured by the holder to form the electrical circuit on the object.

3. The object printing system of claim 2, the controller operatively connected to the aerosol printer being further configured to generate the signal for the electronic component placement system that indicates the electronic component is to be installed in the electrical circuit on the object secured by the holder.

4. The object printing system of claim 3, the controller operatively connected to the aerosol printer being further configured to
    generate the signal for the electronic component placement system to identify the electronic component to be installed in the electrical circuit on the object secured by the holder and the position where the electronic component is to be installed.

5. The object printing system of claim 4, the electronic component placement system further comprising:
    a receptacle configured to hold a plurality of electronic components;
    a gripper configured to retrieve one electronic component from the receptacle;
    a plurality of actuators, the actuators in the plurality of actuators being operatively connected to the gripper; and
    a controller operatively connected to the actuators in the plurality of actuators operatively connected to the gripper and to the controller of the aerosol printer, the controller being configured to operate the actuators operatively connected to the gripper to retrieve with the gripper the electronic component identified by the signal generated by the controller of the aerosol printer and to install the electronic component in the electrical circuit on the object with the gripper in response to the signal generated by the controller of the aerosol printer.

6. The object printing system of claim 5, the electronic component placement system further comprising:
    an imaging unit mounted to move with the gripper, the imaging unit being configured to generate image data of a position opposite the gripper; and
    the controller being operatively connected to the imaging unit, the controller being further configured to receive the image data generated by the imaging unit and to process the received image data to confirm the position for installation of the electronic component.

7. The object printing system of claim 6 wherein the gripper is a vacuum pad.

8. The object printing system of claim 7 wherein the imaging unit is a CCD camera.

9. An object printing system comprising:
    a multi-nozzle extruder configured to extrude a material containing conductive material toward an object secured by a holder to form an electrical circuit on the object;
    a plurality of actuators operatively connected to the multi-nozzle extruder, the actuators in the plurality of actuators being configured to move the multi-nozzle extruder along three orthogonal axes bidirectionally and to rotate the multi-nozzle extruder about two of the orthogonal axes bidirectionally, the two orthogonal axes about which the multi-nozzle extruder rotates being within a plane perpendicular to the third axis; and
    a controller operatively connected to the plurality of actuators and the multi-nozzle extruder, the controller being configured to operate the actuators in the plurality of actuators to move the aerosol printer along three orthogonal axes bidirectionally and to rotate the multi-nozzle extruder about the two orthogonal axes within the plane perpendicular to the third axis bidirectionally, to operate the multi-nozzle extruder to extrude the material containing the conductive material toward the object secured by the holder to form the electrical circuit on the object, and to generate a signal that indicates an electronic component is to be installed in the electrical circuit formed on the object secured by the holder; and
    an electronic component placement system, the electronic component placement system being configured to retrieve the electronic component and install the electronic component in the electrical circuit formed by the multi-nozzle extruder when operated by the controller on the object secured by the holder in response to the electronic component placement system receiving the signal generated by the multi-nozzle extruder that indicates the electronic component is to be installed in the electrical circuit formed on the object secured by the holder.

10. The object printing system of claim 9, the controller being further configured to generate the signal to identify the electronic component to be installed in the electrical circuit on the object secured by the holder and the position where the electronic component is to be installed.

11. The object printing system of claim 10, the electronic component placement system further comprising:
   a receptacle configured to hold a plurality of electronic components;
   a gripper configured to retrieve one electronic component from the receptacle;
   a plurality of actuators, the actuators in the plurality of actuators being operatively connected to the gripper; and
   a controller operatively connected to the actuators in the plurality of actuators operatively connected to the gripper and to the controller of the aerosol printer, the controller being configured to operate the actuators operatively connected to the gripper to retrieve with the gripper the electronic component identified by the signal generated by the controller of the aerosol printer and to install the electronic component in the electrical circuit on the object with the gripper in response to the signal generated by the controller of the aerosol printer.

* * * * *